US010896945B2

(12) United States Patent
Managaki

(10) Patent No.: US 10,896,945 B2
(45) Date of Patent: Jan. 19, 2021

(54) DISPLAY DEVICE INCLUDING CONCAVE/CONVEX STRUCTURE IN THE INORGANIC INSULATION LAYER

(71) Applicant: Japan Display Inc., Tokyo (JP)

(72) Inventor: Nobuto Managaki, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 16/208,933

(22) Filed: Dec. 4, 2018

(65) Prior Publication Data

US 2019/0189731 A1 Jun. 20, 2019

(30) Foreign Application Priority Data

Dec. 19, 2017 (JP) .................. 2017-242391

(51) Int. Cl.
| | |
|---|---|
| G06F 3/041 | (2006.01) |
| H01L 27/32 | (2006.01) |
| G06F 3/044 | (2006.01) |
| H01L 23/532 | (2006.01) |
| H01L 51/52 | (2006.01) |

(52) U.S. Cl.
CPC .......... H01L 27/3276 (2013.01); G06F 3/044 (2013.01); G06F 3/0412 (2013.01); G06F 3/0443 (2019.05); G06F 3/0446 (2019.05); G06F 3/04164 (2019.05); H01L 23/53266 (2013.01); H01L 27/323 (2013.01); H01L 51/5253 (2013.01); H01L 51/5256 (2013.01); *G06F 2203/04103* (2013.01); *G06F 2203/04111* (2013.01)

(58) Field of Classification Search
CPC .......... H01L 27/3276; H01L 23/53266; H01L 51/5253; G06F 3/0412; G06F 3/044
USPC ........................ 257/40; 438/82, 99
See application file for complete search history.

(56) References Cited

U.S. PATENT DOCUMENTS

| | | | |
|---|---|---|---|
| 2014/0264300 A1 | 9/2014 | Kamiya | |
| 2016/0254479 A1* | 9/2016 | Jeong | .................. H01L 51/5256 |
| | | | 257/40 |
| 2017/0123543 A1* | 5/2017 | Choi | ..................... G06F 3/0412 |
| 2017/0262109 A1* | 9/2017 | Choi | ..................... G06F 3/0412 |
| 2017/0277288 A1* | 9/2017 | Choi | ................... H01L 51/0097 |
| 2018/0061898 A1* | 3/2018 | Oh | ........................ H01L 27/322 |

FOREIGN PATENT DOCUMENTS

JP 2014179278 A 9/2014

* cited by examiner

*Primary Examiner* — Didarul A Mazumder
(74) *Attorney, Agent, or Firm* — Michael Best & Friedrich LLP

(57) ABSTRACT

A display device includes a substrate, a circuit element layer on the substrate, a display element layer on the circuit element layer, a sealing film on the display element layer, an oxide film on the sealing film, a barrier metal layer on the oxide film, and a wiring layer on the barrier metal layer, wherein a surface of the sealing film in contact with the oxide film has concave/convexities, and the barrier metal layer is formed by titanium nitride. A height of the concave/convexities of the surface of the sealing film may be less than 30 nm. A thickness of the oxide film may be 5 nm or less.

11 Claims, 14 Drawing Sheets

DISPLAY DEVICE INCLUDING CONCAVE/CONVEX STRUCTURE IN THE INORGANIC INSULATION LAYER

CROSS REFERENCE TO RELATED APPLICATIONS

This application is based upon and claims the benefit of priority from the prior Japanese Patent Application No. 2017-242391, filed on Dec. 19, 2017, the entire contents of which are incorporated herein by reference.

FIELD

An embodiment of the present invention relates to a display device.

BACKGROUND

Electronic devices which are operated by touching images such as icons displayed on a screen are becoming prevalent. A display panel used in such electronic devices is also called a touch panel (or a touch screen).

A conventional touch panel has a structure in which a touch sensor panel and a display panel overlap. However, a structure in which two panels overlapped each other has a problem whereby the thickness of the display device increases. For example, in a display device which is curved or bent called a flexible display, a structure in which a touch sensor panel and a display panel overlap each other is a cause of impeding flexibility.

Therefore, a structure is known in which the function of a touch sensor is built into a display panel. Since a rib structure or a multi-layer structure such as a sealing film exists within a display panel, wiring for use in a touch panel is formed along the surface including a step. However, in this case, there is concern of disconnection or a reduction in connection reliability.

As a technique for preventing a sealing film peeling from a light emitting element, there is a technique of forming a sealing layer by stacking a first barrier layer having barrier properties against moisture and oxygen such as silicon nitride, silicon nitride oxide, silicon oxide, and the like, an base such as amorphous silicon, silicon oxide, and silicon nitride, an intermediate layer covering parts which locally protrude on an upper surface of the base, and a second barrier layer having barrier properties against moisture and oxygen such as silicon nitride and silicon oxynitride (for example, see Japanese Laid Open Patent Application Publication No. 2014-179278). It is required to prevent defects due to diffusion of moisture and oxygen into the interior when adopting a structure in which the function of a touch sensor is built into a display panel. In addition, it is required to preventing wiring used for a touch panel from peeling from a sealing film. Therefore, there is demand for a technique for improving disconnection of the wiring used for the touch panel and connection reliability.

SUMMARY

A display device according to one embodiment of the present invention includes a substrate, a circuit element layer on the substrate, a display element layer on the circuit element layer, a sealing film on the display element layer, an oxide film on the sealing film, a barrier metal layer on the oxide film, and a wiring layer on the barrier metal layer, wherein a surface of the sealing film in contact with the oxide film has concave/convexities, and the barrier metal layer includes titanium nitride.

A display device according to one embodiment of the present invention includes a pixel part arranged with a plurality of pixels on a substrate, a terminal part arranged on the outer side of the pixel part, the terminal part including a plurality of terminal electrodes, a sealing layer covering the pixel part, a detection electrode overlapping the pixel part and arranged on the sealing layer, and wiring arranged on the sealing layer and electrically connected to the detection electrode and the terminal electrode, wherein the sealing layer includes at least one inorganic insulation layer, a surface of the inorganic insulation layer includes a concave/convex structure, and he wiring is arranged in contact with a surface including the concave/convex structure of the inorganic insulation layer.

DESCRIPTION OF EMBODIMENTS

Figure 1:
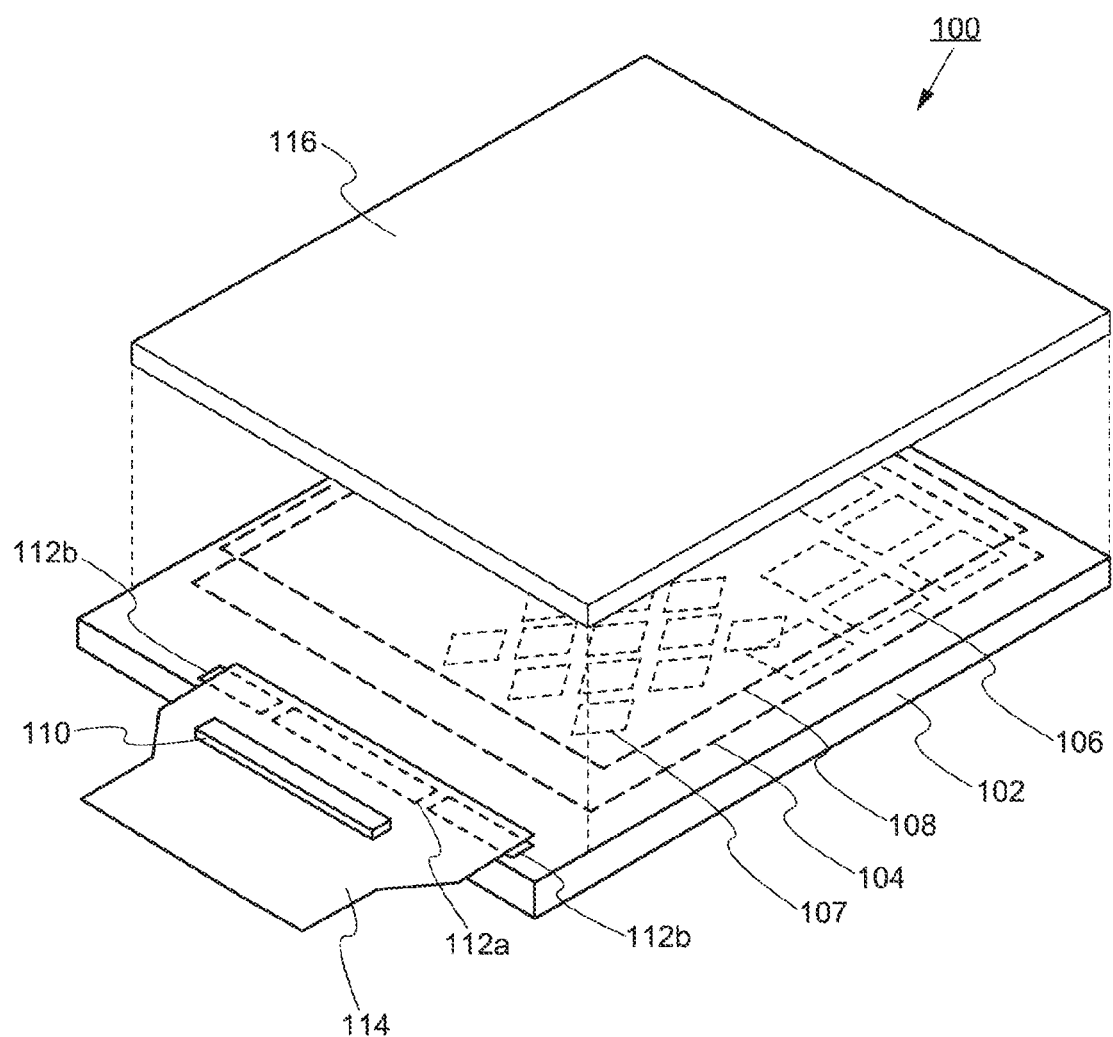
FIG. 1 is a perspective diagram showing a structure of a display device related to one embodiment of the present invention.

The embodiments of the present invention are explained below while referring to the drawings. However, the present invention can be implemented in various modes without departing from the gist of the invention and should not to be interpreted as being limited to the description of the embodiments exemplified below. Although the drawings may be schematically represented in terms of width, thickness, shape, and the like of each part as compared with their actual mode in order to make explanation clearer, it is only an example and an interpretation of the present invention is not limited. In addition, in the present specification and each drawing, the same symbols (or symbols such as a, b attached after a number) are provided to the same elements as those described with reference to preceding figures and a detailed explanation may be omitted accordingly. Furthermore, characters denoted by "first", "second" attached to each element are convenient signs for use in distinguishing each element and unless otherwise stated do not have any further meaning.

In the present specification, when a certain member or region is "above (or below)" another member or region, unless otherwise noted this includes not only the case of being directly above "or directly below" another member or region, but also the case of being further above "or further below" another member or region, that is, this also includes the case of above or below another member or region with a separate structural element included therebetween. Furthermore, in the explanation below, unless otherwise stated, a side on which a first film is arranged with respect to a substrate is referred to as "above" or "upper" in a cross-sectional view, and the reverse is explained as "below" or "lower".

<Display Device Structure>

FIG. 1 is a perspective diagram showing a display device 100 according to one embodiment of the present invention. In the display device 100, a pixel part 104 and the touch sensor 108 are arranged on one main surface of a substrate 102 which has an insulating surface. A plurality of pixels 106 are arranged in the pixel part 104. The plurality of pixels 106 are arranged in, for example, a row direction and a column direction in the pixel part 104. The touch sensor 108 is arranged to overlap with the pixel part 104. In other words, the touch sensor 108 is arranged to overlap the plurality of pixels 106. In the touch sensor 108, a plurality of detection electrodes 107 are arranged in a matrix shape, and are electrically connected to each other in the row direction or the column direction. Furthermore, here the pixel 106 and the touch sensor 108 are schematically represented, and their size relationship is not limited to the description shown in FIG. 1.

The display device 100 includes a first terminal region 112a which is input with an image signal and a second terminal region 112b which is input with and outputs a signal of the touch sensor 108. The first terminal region 112a and the second terminal region 112b are arranged at either end part of one main surface of the substrate 102 which has an insulating surface. The first terminal region 112a and the second terminal region 112b include a plurality of terminal electrodes arranged along the edge of the substrate 102 which has an insulating surface. Each of the plurality of terminal electrodes of the first terminal region 112a and the second terminal region 112b is electrically connected to a flexible printed wiring substrate 114. A drive circuit 110 outputs an image signal to a pixel 106. The drive circuit 110 is arranged on one main surface of the substrate 102 or the flexible printed wiring substrate 114.

The substrate 102 which has an insulating surface is formed by members such as glass or plastic (polycarbonate, polyethylene terephthalate, polyimide, polyacrylate) and the like. In the case when the material of the substrate 102 is plastic, it is possible to provide flexibility to the display device 100 by thinning the substrate. That is, a flexible display can be provided by using a plastic substrate as the substrate 102.

A polarization plate 116 including a polarizer may be arranged on the pixel part 104 and the touch sensor 108. For example, the polarization plate 116 is formed from a polarizer which exhibits circular polarization. The polarization plate 116 is formed by a film base material including a polarizer. By arranging the polarization plate 116 to overlap the pixel part 104, it is possible to prevent reflection (mirroring) of the display screen. The polarization plate 116 may also include a color filter layer and a light shielding layer in addition to a polarizer as appropriate.

Furthermore, although omitted in FIG. 1, the pixel 106 includes a display element and a circuit element. The touch sensor 108 is preferred to be a capacitance type, and a sensing part is formed by a first detection electrode (Tx wiring) and a second detection electrode (Rx wiring) in the touch sensor 108. An interlayer insulating layer is arranged between the pixel part 104 and the touch sensor 108 and is arranged so as not to electrically short circuit each other.

Figure 2:
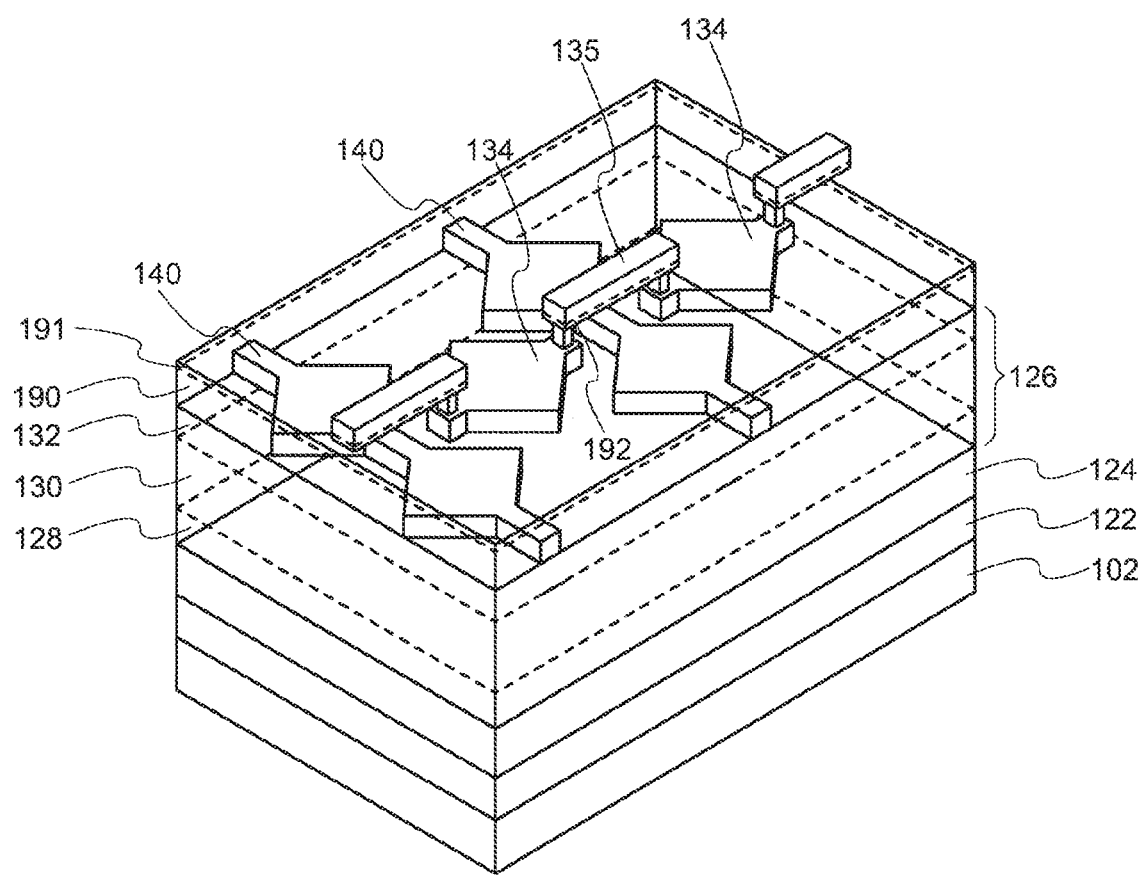
FIG. 2 is a perspective diagram showing a structure of a pixel region in a display device related to one embodiment of the present invention.

FIG. 2 is a perspective diagram showing a structure of the pixel part 104 and the touch sensor 108 arranged above. As is shown in FIG. 2, the pixel part 104 includes a circuit element layer 122 arranged with a circuit element above the substrate 102, and a display element layer 124 arranged with a display element. A sealing layer 126 is arranged above the display element layer 124. The sealing layer 126 is arranged to cover the surface on the upper side of a pixel region when the observer side main surface is upwards.

The circuit element layer 122 includes an interlayer insulating layer. The interlayer insulating layer insulates wiring arranged in different layers. The interlayer insulating layer includes at least one inorganic interlayer insulating layer and at least one organic interlayer insulating layer. The inorganic interlayer insulating layer is formed from an inorganic insulating material such as silicon oxide, silicon nitride, silicon oxynitride and aluminum oxide or the like. The organic interlayer insulating layer is formed from an organic insulating material such as acrylic and polyimide. The circuit element layer 122 includes an active element such as a transistor, a passive element such as a capacitor and a resistor, a wiring connecting these elements, and these elements are arranged to be buried in the interlayer insulating layer.

In the display element layer 124, a light-emitting element or an electrooptical element which develops an electrooptical effect by applying a voltage is used as a display element. In the case where an organic EL element is used as the light emitting element, the display element layer 124 is formed including a pair of electrodes distinguished as an anode and a cathode, an organic layer including an organic EL material, and a partition layer having insulating properties for separating adjacent organic EL elements. The organic EL element is electrically connected to a transistor of the circuit element layer 122.

The sealing layer 126 has a structure in which a plurality of insulating films is stacked. FIG. 2 has a structure in which a first inorganic insulating layer 128, an organic insulating layer 130 and a second inorganic insulating layer 132 are stacked as the sealing layer 126. The sealing layer 126 increases the sealing performance by a stacked structure in which different materials are combined. For example, even in the case when there are defects in the first inorganic insulating layer 128, the organic insulating layer 130 fills the defect parts, and the second inorganic insulating layer 132 and the third inorganic insulating layer 190 are further arranged whereby it is possible to compensate for a deterioration in sealing performance due to the defects. The first inorganic insulating layer 128, the second inorganic insulating layer 132 and the third inorganic insulating layer 190 may also be arranged to cover the entire surface of the pixel part 104 and at least a part of a region on the outer side the pixel part 104. The first inorganic insulating layer 128 and the second inorganic insulating layer 132 may be formed to cover a region further on the outer side of the second inorganic insulating layer 132. The outer periphery end parts of the first inorganic insulating layer 128 and the second inorganic insulating layer 132 do not necessarily have to match.

A first detection electrode 134 and a second detection electrode 140 which form a sensing part of the touch sensor 108 are arranged on the second inorganic insulating layer 132. A third inorganic insulating layer 190 is arranged on an upper layer side of the first detection electrode 134 and the second detection electrode 140. Bridge wiring 135 is arranged on an upper surface of the third inorganic insulating layer 190. Furthermore, although not shown in FIG. 2, the upper surface of the third inorganic insulating layer 190 and the second detection electrode 140 may be covered by an overcoat layer.

The first detection electrode 134 is arranged to extend in a first direction and the second detection electrode 140 is arranged to extend in a second direction which intersects the first direction. Although the first direction can be an arbitrary direction, it may be, for example, a direction along a column direction corresponding to the arrangement of the pixels. In this case, the second direction may be a direction along the row direction of the pixels. FIG. 2 shows a structure in which a plurality of rectangular electrodes which form the second detection electrode 140 are connected, and shows a structure in which rectangular electrodes which form the first detection electrode 134 are arranged apart from each other. The bridge wiring 135 electrically connects two first detection electrodes 134 arranged apart from each other via a contact hole arranged in the third inorganic insulating layer 190. A plurality of first detection electrodes 134 and a plurality of second detection electrodes 140 are arranged. In the present embodiment, a group formed by a plurality of first detection electrodes 134 is also called a first detection electrode pattern, and a group formed by a plurality of second detection electrodes 140 is also called a second detection electrode pattern. Furthermore, in FIG. 2, only a part of the first detection electrode 134 and a part of the second detection electrode 140 are shown, and a plurality of these detection electrodes are arranged aligned across essentially the entire pixel part 104.

Although not shown in detail in FIG. 2, the surface of the third inorganic insulating layer 190 has a fine concave/convex structure of about several nanometer to several hundred nanometer. These concave/convexities preferably have a height less than 30 nm. A concave/convex structure having such a size is formed by etching the surface of the third inorganic insulating layer 190. For example, in the case where the third inorganic insulating layer 190 is formed using silicon nitride, by performing a dry etching treatment using a gas such as carbon tetrafluoride ($CF_4$) or sulfur hexafluoride ($SF_6$), it is possible to form a concave/convex structure in the surface of the third inorganic insulating layer 190. The etching treatment may be performed to an extent so that the surface of the third inorganic insulating layer 190 is slightly etched. For example, by etching the surface of the third inorganic insulating layer 190 by about several nanometer to several hundreds nanometer, a concave/convex structure having substantially the same size is formed on the surface of the third inorganic insulating layer 190. Since the third inorganic insulating layer 190 has this type of concave/convex structure, it is possible to increase adhesion of the bridge wiring 135.

In the case where the third inorganic insulating layer 190 is formed from silicon nitride, an oxide film 191 may be formed on the outermost surface. The oxide film 191 may have a thickness of 1 nm or more, for example, the oxide film 191 may have a thickness corresponding to one atomic layer to several atomic layers. This type of oxide film 191 can be formed, for example, by a plasma treatment using an oxygen gas or a gas containing oxygen oxygen (for example, nitrous oxide ($N_2O$)) on the surface of the third inorganic insulating layer 190 which is formed from silicon nitride, and oxidizing the surface. Since oxidation by a plasma treatment can be performed even at low temperatures (200° C. or less), it is possible to perform the treatment without problems even in a state where a display element is formed on a lower layer side of the sealing layer 126. In addition, as another method, a silicon oxide film may be deposited on the upper surface of the third inorganic insulating layer 190 by a plasma CVD method (Plasma Enhanced Chemical Vapor Deposition method). It is preferred that the thickness of the deposited oxide film 191 is 5 nm or less in an island shape or thin film shape. Since this type of oxide film 191 is formed on the surface of the third inorganic insulating layer 190, it is possible to increase adhesion of the bridge wiring 135.

A barrier metal layer 192 may be arranged on a surface of the bridge wiring 135 which contacts the third inorganic insulating layer 190 (or the oxide film 191). The barrier metal layer 192 is formed by a method which has excellent covering properties such as chemical vapor deposition (CVD) method. A metal nitride or metal oxide having conductivity is used as the material of the barrier metal layer 192, and titanium nitride (TiN) is preferably used. The bridge wiring 135 includes this type of barrier metal layer 192 and is formed using a metal material such as aluminum (Al), titanium (Ti), tantalum (Ta), molybdenum (Mo) and tungsten (W). By arranging the barrier metal layer 192, it is possible to prevent oxygen from diffusing from the oxide film 191 to a metal film which forms wiring and prevent defects due to high resistance.

Figure 3:
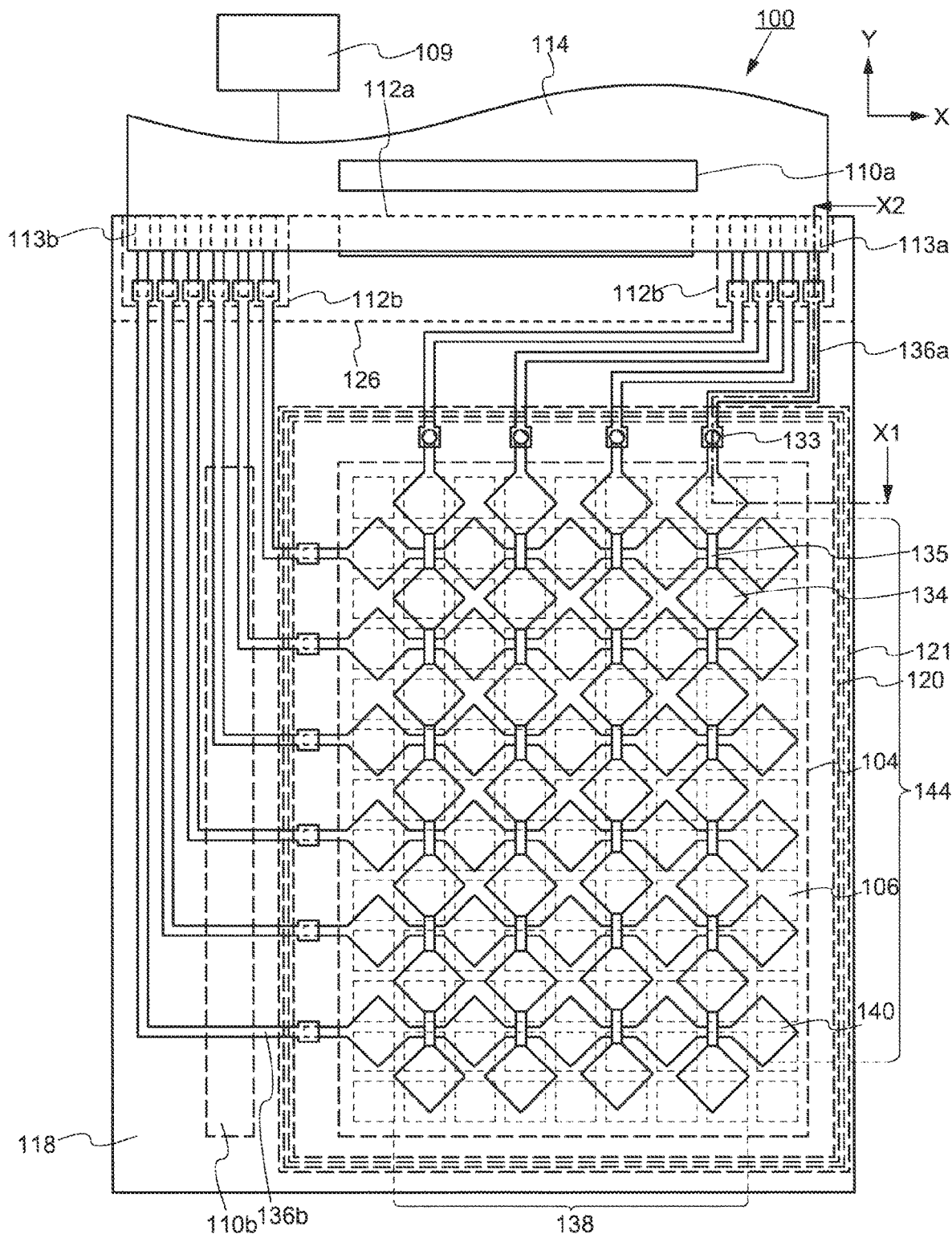
FIG. 3 is a planar diagram showing a structure of a display device related to one embodiment of the present invention.

FIG. 3 shows a planar diagram of the display device 100. FIG. 3 schematically shows an arrangement of the first detection electrode 134 and the second detection electrode 140. For the purposes of explanation, FIG. 3 shows the vertical direction with respect to the surface of the paper as the Y direction and the horizontal direction as the X direction.

In FIG. 3, a plurality of first detection electrodes 134 extend in the Y direction and a plurality of second detection electrodes 140 extend in the X direction. Here, one group of the plurality of first detection electrodes 134 is set as a first detection electrode pattern 138, and one group of the plurality of second detection electrodes 140 is set as a second detection electrode pattern 144.

Furthermore, the shapes of the first detection electrode 134 and the second detection electrode 140 are arbitrary. The first detection electrode 134 and the second detection electrode 140 may be a rectangular (striped) type or may have a shape which connects diamond type electrodes as is shown in FIG. 3. By adopting a detection electrode having such a rectangular (striped) type or diamond type shape which is arranged continuously, detection sensitivity of the touch sensor 108 can be improved since good capacitive coupling between the first detection electrode 134 and the second detection electrode 140 is formed.

The first detection electrode pattern 138 and the second detection electrode pattern 144 are arranged in a region which overlaps the pixel part 104. In other words, the first detection electrode 134 and the second detection electrode 140 are arranged to overlap at least a part of a pixel 106 (a part of a light emitting element arranged in a pixel). By adopting this type of arrangement, it is possible to sense the presence or absence of a touch using the touch sensor 108 while also displaying an image such as an icon on the pixel part 104.

Figure 4:
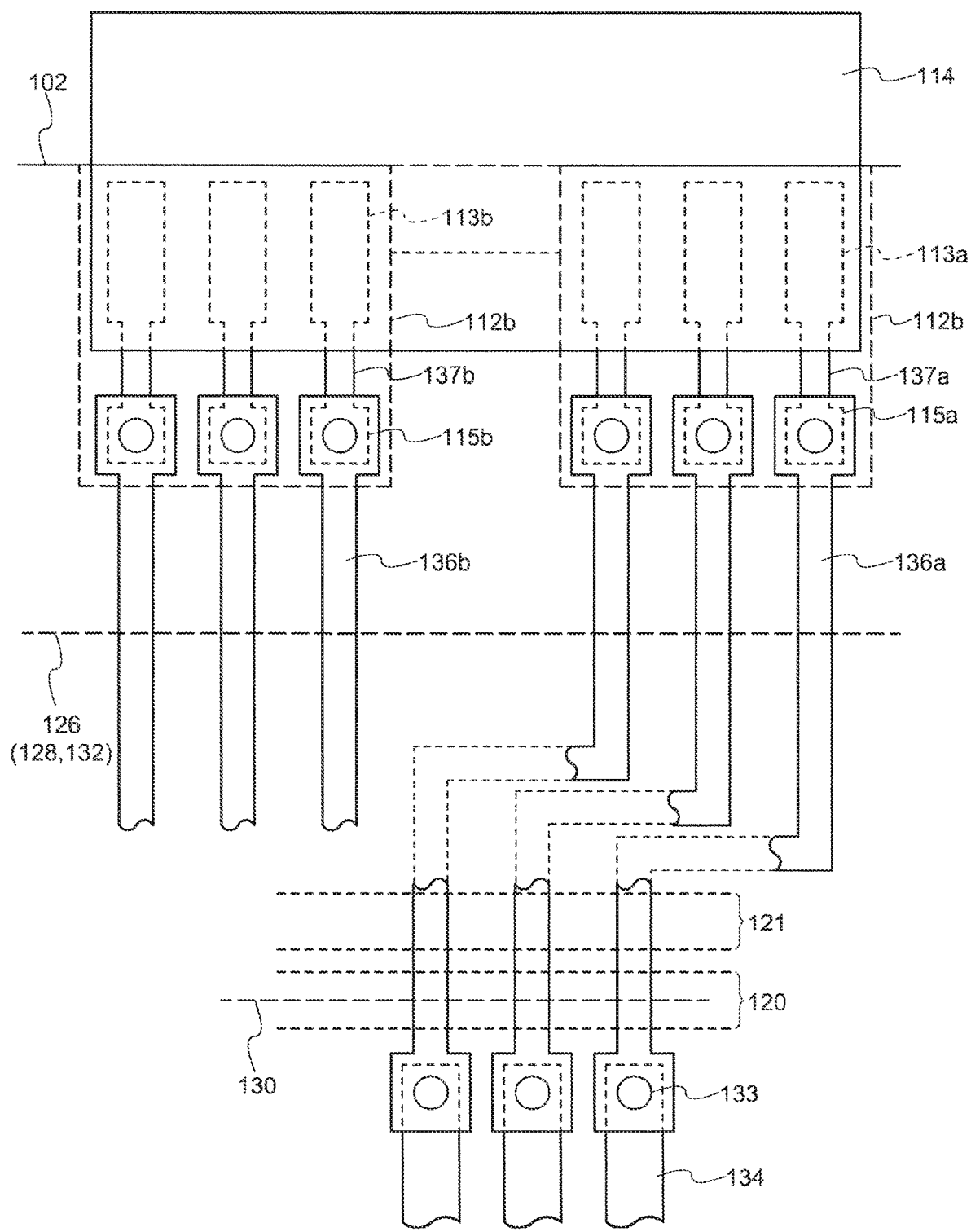
FIG. 4 is a planar diagram showing a structure of a periphery region of a display device related to one embodiment of the present invention.

FIG. 4 is a planar diagram showing a structure of a periphery region of the display device 100 according to one embodiment of the present invention. FIG. 4 is a partially enlarged diagram of the planar diagram shown in FIG. 3. Referring to FIG. 3 and FIG. 4, the pixel part 104 is covered by the sealing layer 126 (dotted line indicated by reference number 126 shows the position of the end part of the sealing layer in FIG. 3 and FIG. 4). The first detection electrode 134 is electrically connected to a first wiring 136a in an opening part 133 arranged in the sealing layer 126 which is located on the outer side of the pixel part 104. The first wiring 136a is electrically connected to a second terminal 115a which is a connection terminal for use in a touch panel arranged in second terminal region 112b. The second terminal 115a is electrically connected to the first terminal 113a which is electrically connected to a flexible printed wiring substrate 114 via a second wiring 137a.

The second detection electrode 140 is electrically connected to the first wiring 136b which is arranged on the outer side of the pixel part 104. The first wiring 136b is electrically connected to the second terminal 115b of the second terminal region 112b. The structures of the first wiring 136b, the first terminal 113b and the second terminal 115b are the same as the structures of the first wiring 136a, the first terminal 113a and the second terminal 115a respectively.

Although not shown in the diagram, in FIG. 3, a plurality of transistors is arranged in a drive circuit 110b included in the periphery region 118 on the outer side of the pixel part 104. For example, the plurality of transistors includes an n-channel transistor, a p-channel transistor or both. A drive circuit is formed by this type of a transistor.

A first opening region 120 and a second opening region 121 which surround the pixel part 104 respectively are arranged in substrate 102. Although details of the first opening region 120 and the second opening region 121 are described herein, an organic material is removed between the substrate 102 and the first inorganic insulating layer 128 which forms the sealing layer 126. In other words, the interlayer insulating layer above the substrate 102 includes at least one inorganic interlayer insulating layer and an organic interlayer insulating layer, and includes a stacked region in which an inorganic interlayer insulating layer and an organic interlayer insulating layer are stacked, and an opening region in which the organic interlayer insulating layer is removed and the inorganic interlayer insulating layer remains. The details of the first opening region 120 and the second opening region 121 are explained using the cross-sectional structure of the pixel part 104 described herein. The first wirings 136a and 136b are extracted out from the pixel part 104 to the periphery part of the substrate 102 passing above the first opening region 120. That is, the first wirings 136a and 136b are arranged to cross the first opening region 120.

Figure 5:
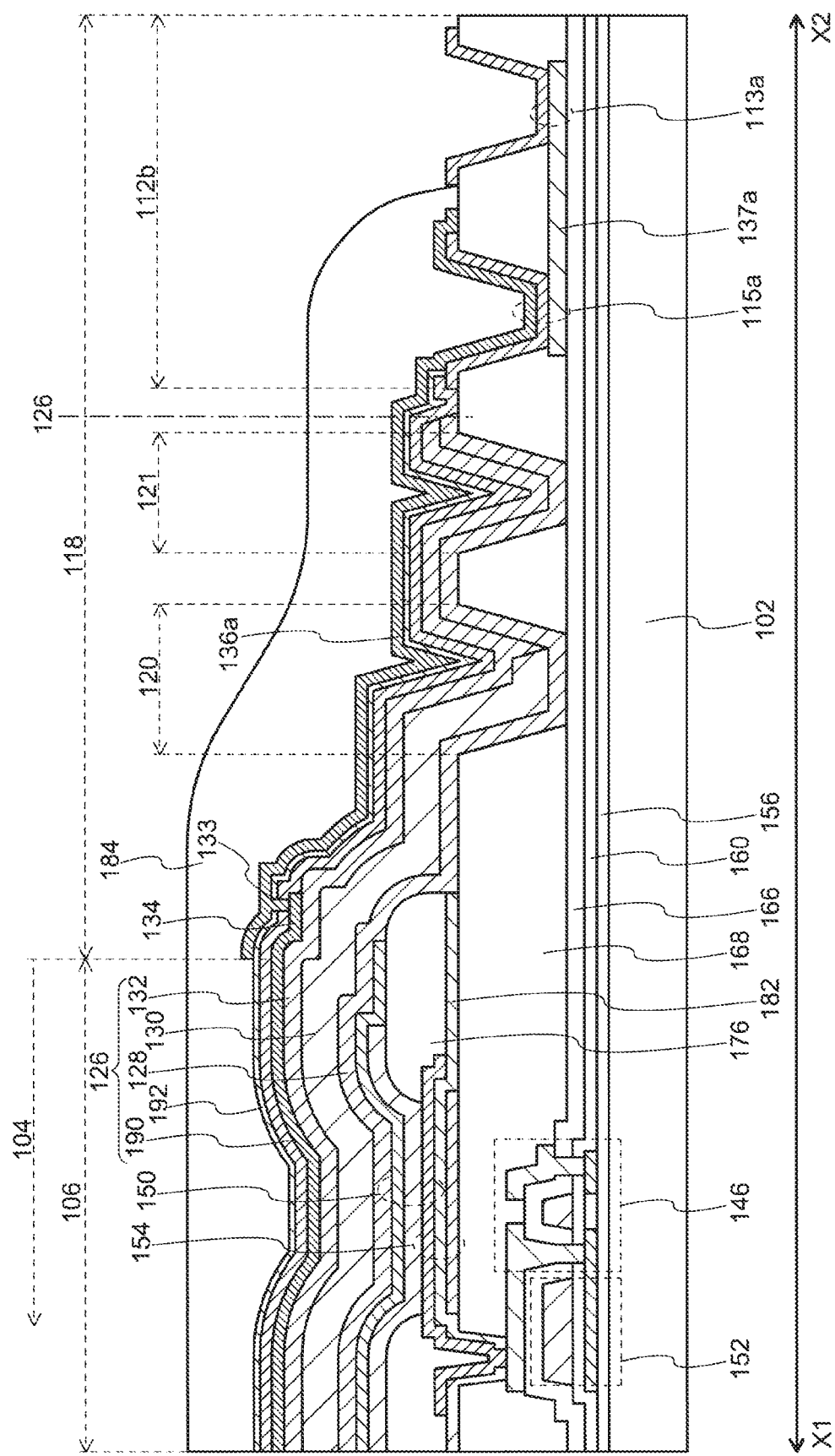
FIG. 5 is a cross-sectional diagram in a line X1-X2 in FIG. 3 showing a structure of a display device related to one embodiment of the present invention.

As is shown in FIG. 3, the first opening region 120 and the second opening region 121 are arranged between the pixel part 104 and the second terminal region 112b. The first opening region 120 and the second opening region 121 include opening parts which pass through the second insulating layer 168. The first opening region 120 and the second opening region 121 are arranged along at least one side of the pixel part 104. It is preferred that the first opening region 120 and the second opening region 121 are arranged to surround the pixel part 104. As is shown in FIG. 5, the second insulating layer 168 is separated into a pixel part 104 side and a drive circuit 110b side by the first opening region 120. In other words, the second insulating layer 168 which is formed from an organic material is removed at the opening of the first opening region 120.

As is shown in FIG. 4, in the display device 100 according to one embodiment of the present invention, the first opening region 120 and the second opening region 121 are arranged at a position that crosses between the opening part 133 and the second terminals 115a and 115b. In the present embodiment, the first wirings 136a and 136b are extracted from the pixel part 104 to the periphery part of the substrate 102 passing above the first opening region 120 and the second opening region 121.

As is shown in FIG. 3, the second terminal region 112b is electrically connected to a touch sensor control unit 109 via the flexible printed wiring substrate 114. That is, a detection signal obtained by the first detection electrode 134 and the second detection electrode 140 is transmitted to the second terminal region 112b by the first wirings 136a and 136b and the second wirings 137a and 137b, and then output to the touch sensor control unit 109 via the flexible printed wiring substrate 114.

In the display device 100 according to one embodiment of the present invention, the first detection electrode pattern 138 and the second detection electrode pattern 144 which form a sensing part of the touch sensor 108 are arranged on the substrate 102. By adopting this type of structure, is possible to reduce the thickness of the display device 100 since it is not necessary to externally attach a touch sensor which is provided as a separate part.

FIG. 5 shows a cross-sectional structure of the display device 100 according to one embodiment of the present invention. FIG. 5 schematically shows a cross-sectional structure of the pixel part 104 and the periphery region 118 located on the outer side of the pixel part 104. This cross-sectional structure corresponds to the structure along the line X1-X2 shown in FIG. 3.

Figure 6:
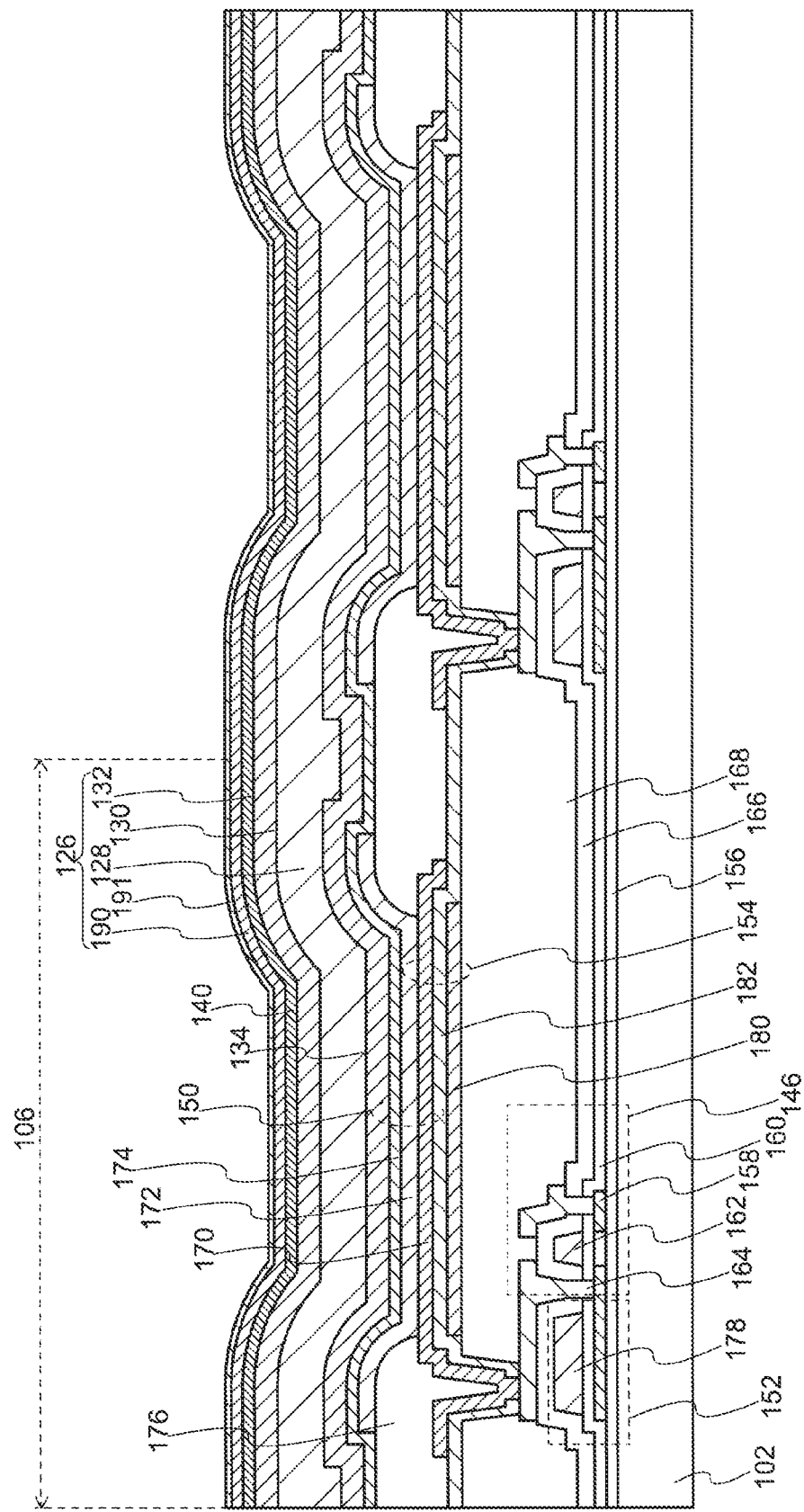
FIG. 6 is a cross-sectional diagram showing a structure of a pixel region in a display device related to one embodiment of the present invention.

As is shown in FIG. 5, the pixel part 104 and the periphery region 118 are arranged on the substrate 102. The periphery region 118 includes a wiring part including the first wiring 136a and a second terminal region 112b which includes the first terminal 113a and the second terminal 115a. A first opening region 120 and a second opening region 121 formed along the outer periphery of a region where the pixel part 104 and the organic insulating layer 130 are respectively formed are arranged in the periphery region 118. The pixel part 104 includes a transistor 146, a light emitting element 150, a first capacitor element 152 and a second capacitor element 154. Details of a pixel 106 which includes these elements are shown in FIG. 6. Neither the second insulating layer 168, a partition wall layer 176 or the organic insulating layer 130 are arranged on the substrate 102. Moisture easily passes through since these layers are formed using an organic insulating material. Therefore, it is possible to block a moisture entrance path from the exterior by arranging the first opening region 120 and the second opening region 121 to surround the pixel part 104.

As is shown in FIG. 5, an end part of the organic insulating layer 130 which forms the sealing layer 126 is arranged in the first opening region 120. The first inorganic insulating layer 128, the second inorganic insulating layer 132 and the third inorganic insulating layer 190 extend to the outer side of the end part of the organic insulating layer 130. In this way, a structure in which the first inorganic insulating layer 128 and the second inorganic insulating layer 132 contact with each other is formed in the outer side region of the organic insulating layer 130. In other words, a structure is provided in which the organic insulating layer 130 is sandwiched between the first inorganic insulating layer 128 and the second inorganic insulating layer 132, and the end part is not exposed. By adopting this type of structure, it is possible to prevent moisture or the like from entering from the end part of the organic insulating layer 130.

A sealing structure is formed by separating the second insulating layer 168 formed from an organic insulating material in the periphery region 118 by the first opening region 120 and by arranging an inorganic material layer to cover the side surface and the bottom surface of the first opening region 120. By sandwiching the second insulating layer 168 which is formed of an organic insulating material between inorganic material layers, it is possible to prevent moisture from entering the pixel part 104 from the end part of the substrate 102. It is possible for the first opening region 120 which separates the second insulating layer 168 to function as a moisture blocking region and this structure can be called a "moisture blocking structure".

FIG. 6 shows a cross-sectional structure of a pixel 106 of the display device 100 according to an embodiment of the present invention. An explanation of parts which have the same structure as in FIG. 5 may be omitted.

As shown in FIG. 6, the light emitting element 150 is electrically connected to the transistor 146. A current flowing between the source and the drain of the transistor 146 is controlled by an image signal which is applied to the gate, and the light emitting luminosity of the light emitting element 150 is controlled by this current. The first capacitor element 152 holds a gate voltage of the transistor 146 and the second capacitor element 154 is arranged in order to prevent a potential of the pixel electrode 170 from unintentionally fluctuating. Furthermore, the second capacitor element 154 is not an essential structure and can be omitted.

As is shown in FIG. 6, a base insulating layer 156 is arranged on the first surface of the substrate 102. The transistor 146 is arranged above the base insulating layer 156. The transistor 146 includes a structure in which the semiconductor layer 158, the gate insulating layer 160 and the gate electrode 162 are stacked. The semiconductor layer 158 is formed from an amorphous or polycrystalline silicon or an oxide semiconductor and the like. A source/drain wiring 164 is arranged on an upper layer of the gate electrode 162 interposed by the first insulating layer 166. A second insulating layer 168 is arranged above the source/drain wiring 164 as a planarization layer.

The first insulating layer 166 and the second insulating layer 168 are interlayer insulating layers. The first insulating layer 166 is a type of an inorganic interlayer insulating layer and is formed from an inorganic insulating material such as silicon oxide, silicon nitride, silicon oxynitride or aluminum oxide and the like. The second insulating layer 168 is a type of organic interlayer insulating layer and is formed from an organic insulating material such as polyimide and acrylic. An interlayer insulating layer is formed by stacking in order the first insulating layer 166 and the second insulating layer 168 from the substrate 102 side. By arranging the second insulating layer 168 which is formed from an organic insulating material above the first insulating layer 166, concave/convexities due to the transistor 146 and the like are buried and the surface of the first insulating layer 166 is planarized.

The light emitting element 150 is arranged above on an upper surface of the second insulating layer 168. The light emitting element 150 has a structure in which a pixel electrode 170 which is electrically connected to the transistor 146 and an organic layer 172 and a counter electrode 174 are stacked. The light emitting element 150 is a two-terminal element and light emission of the light emitting element 150 is controlled by controlling a value of a current which flows between the pixel electrode 170 and the counter electrode 174. A partition wall layer 176 is arranged above the second insulating layer 168 to cover a periphery part and to expose an inner side region of the pixel electrode 170. The counter electrode 174 is arranged on an upper surface of the organic layer 172. The organic layer 172 is arranged from a region which overlaps the pixel electrode 170 to an upper surface part of the partition wall layer 176. The partition wall layer 176 is formed from an organic resin material in order to cover a periphery part of the pixel electrode 170 and to form a smooth step at the end part of the pixel electrode 170. Acrylic or polyimide and the like is used as the organic resin material.

The organic layer 172 is formed from a single layer or a plurality of layers including an organic EL material. The organic layer 172 is formed using a low molecular weight or high molecular weight organic material. In the case where a low molecular weight organic material is used, the organic layer 172 may include, in addition to the light emitting layer including an organic EL material, a hole injection layer, an electron injection layer, a hole transport layer and an electron transport layer and the like. For example, the organic layer 172 can have a structure in which a light emitting layer is sandwiched between a hole injection layer and an electron injection layer. In addition to the hole injection layer and the electron injection layer, a hole transport layer, an electron transport layer, a hole blocking layer and an electron blocking layer may be appropriately added to the organic layer 172. In addition, although the organic layer 172 is individually formed in each pixel electrode 170 in FIG. 6, a part or all of the layers which form the organic layer 172 may be continuously formed across a plurality of pixel electrodes.

Furthermore, in the present embodiment, the light emitting element 150 has a so-called top emission type structure in which light emitted by the organic layer 172 is radiated to the counter electrode 174 side. As a result, it is preferred that the pixel electrode 170 has light reflectivity. In addition to the pixel electrode 170 being formed from a light reflective metallic material such as aluminum (Al) or silver (Ag) and the like, a structure is provided in which a transparent conductive layer of ITO (Indium Tin Oxide) or IZO (Indium Zinc Oxide) and a light reflective metal layer are stacked.

The counter electrode 174 is formed from a transparent conductive film such as ITO or IZO which has light translucency and conductivity in order to allow light emitted from the organic layer 172 to pass through. A layer containing an alkali metal such as lithium or an alkaline earth metal such as magnesium may be arranged at the interface between the counter electrode 174 and the organic layer 172 in order to increase carrier injection properties.

Using the gate insulating layer 160 as a dielectric film, the first capacitor element 152 is formed in a region where the semiconductor layer 158 and the first capacitor electrode 178 overlap. Using a third insulating layer 182 arranged between the pixel electrode 170 and the second capacitor electrode 180 as a dielectric film, the second capacitor element 154 is formed by the pixel electrode 170 and a second capacitor electrode 180 arranged overlapping the pixel electrode. The third insulating layer 182 is formed of an inorganic insulating material such as silicon nitride.

A sealing layer 126 is arranged above the light emitting element 150. The sealing layer 126 is arranged to prevent moisture and the like from entering the light emitting element 150. The sealing layer 126 has a structure in which the first inorganic insulating layer 128, the organic insulating layer 130 and the second inorganic insulating layer 132 are stacked from the light emitting element 150 side. The first inorganic insulating layer 128 and the second inorganic insulating layer 132 are formed from an inorganic insulating material such as silicon nitride, silicon oxynitride or aluminum oxide and the like. The first inorganic insulating layer 128, the second inorganic insulating layer 132 and the third inorganic insulating layer 190 are formed by coating these inorganic insulating materials using a sputtering method or a plasma CVD method and the like. The first inorganic insulating layer 128, the second inorganic insulating layer 132 and the third inorganic insulating layer 190 are formed to a thickness of 0.1 µm to 10 µm, preferably 0.5 µm to 5 µm. An oxide film 191 may be arranged on the surface of the third inorganic insulating layer 190.

The organic insulating layer 130 is preferred to be formed from an acrylic resin, polyimide resin or epoxy resin and the like. The organic insulating layer 130 is arranged at a thickness of 1 µm to 20 µm, preferably 2 µm to 10 µm. The organic insulating layer 130 is formed by a coating method such as spin coating or a vapor deposition method using an organic material source. It is preferred that the organic insulating layer 130 is formed in a predetermined region which includes the pixel part 104 so as to cover the pixel part 104 and be sandwiched between the first inorganic insulating layer 128 and the second inorganic insulating layer 132. For example, as shown in FIG. 5, it is preferred that an end part (outline part) of the organic insulating layer 130 is arranged between the pixel part 104 and the first opening region 120. As a result, after forming the organic insulating layer 130 on the entire surface of the substrate 102 by a coating method, it is preferred that the outer periphery region is removed by etching, or is formed in a predetermined pattern in advance by a vapor deposition method (mask vapor deposition) using a mask which opens a deposition surface, by inkjet printing, flexographic printing or by gravure printing. Furthermore, as is shown in FIG. 5, an overcoat layer 184 which covers the wiring part of the pixel part 104 and the periphery region 118 and the second terminal 115a and exposes the first terminal 113a is arranged in an upper layer of the sealing layer 126.

The first detection electrode 134 and the second detection electrode 140 may be transparent electrodes which are formed using a transparent conductive film in order to allow light emitted from the light emitting element 150 to pass through. A film of ITO or IZO which are one type of transparent conductive film, is formed by a sputtering method.

The first detection electrode 134 and the second detection electrode 140 may be formed as a transparent electrode by a printing method using a metal nanowire in addition to an oxide conductive material such as ITO and IZO or may be mesh metal wiring using a metal film. In this case, the mesh metal wiring means a shape obtained by forming a conductive layer part which forms the first detection electrode 134 and the second detection electrode 140 only in a region which does not overlap the light emitting element 150. For example, at least one of the first detection electrode 134 and the second detection electrode 140 may be formed by a mesh wiring having a stacked structure which includes a titanium (Ti) layer, an aluminum (Al) layer and a titanium (Ti) layer.

Preferably, the first detection electrode 134 is formed by a mesh wiring having a stacked structure which includes a titanium layer, an aluminum layer and a titanium layer, and the second detection electrode 140 may be a diamond electrode formed by a transparent conductive film such as ITO or IZO. In this case, the first detection electrode 134 forms an opening part 133 for electrically connecting with the first wirings 136a and 136b above the second inorganic insulating layer 132, and since titanium is located on the outermost surface of the first detection electrode 134 in a process of exposing a terminal by removing an inorganic insulating layer above the first terminal region 112a and the second terminal region 112b, the process likelihood increases.

More preferably, each of the first detection electrode 134 and the second detection electrode 140 may be formed by a mesh wiring having a stacked structure which includes a titanium layer, an aluminum layer and a titanium layer. Also, in this case, the first detection electrode 134 forms an opening part 133 for electrically connecting with the first wiring 136a and 136b above the second inorganic insulating layer 132, and since titanium is located on the outermost surface of the first detection electrode 134 in a process of exposing a terminal by removing an inorganic insulating layer above the first terminal region 112a and the second terminal region 112b, the process likelihood increases. Furthermore, even if the wiring for routing from the pixel part 104 to the periphery region 118 is formed using either the first detection electrode 134 or the second detection electrode 140, since it is unnecessary to consider a reduction in film thickness due to etching unlike the case of forming a routing wiring by a transparent conductive film such as ITO or IZO, a thick film is unnecessary and low resistance can be realized.

FIG. 3 and FIG. 4 show a structure in which a first end part of the first wiring 136a is electrically connected to the first detection electrode 134 and a second end part on the opposite side to the first end part is electrically connected to the second terminal 115a. The first wiring 136a is electrically connected to the first detection electrode 134 at the opening part 133 arranged in the third inorganic insulating layer 190. The first wiring 136a is arranged along an upper surface of the third inorganic insulating layer 190 from the connection part with the first detection electrode 134 to the second terminal 115a. Since the third inorganic insulating layer 190 is arranged along a step formed by the first opening region 120 and the second opening region 121, the first wiring 136a is similarly arranged along the step.

As is schematically shown in FIG. 5, in the case when the first wiring 136a is arranged along a step surface, the sticking force (also called "adhesion") with the third inorganic insulating layer 190 which is a base surface becomes a problem. When adhesion between the first wiring 136a and the third inorganic insulating layer 190 is weak, there is a problem whereby the first wiring 136a is peeled off. In order to deal with such a problem, in the present embodiment, peeling of the first wiring 136a is prevented by controlling the surface state of the third inorganic insulating layer 190.

Figure 8A:
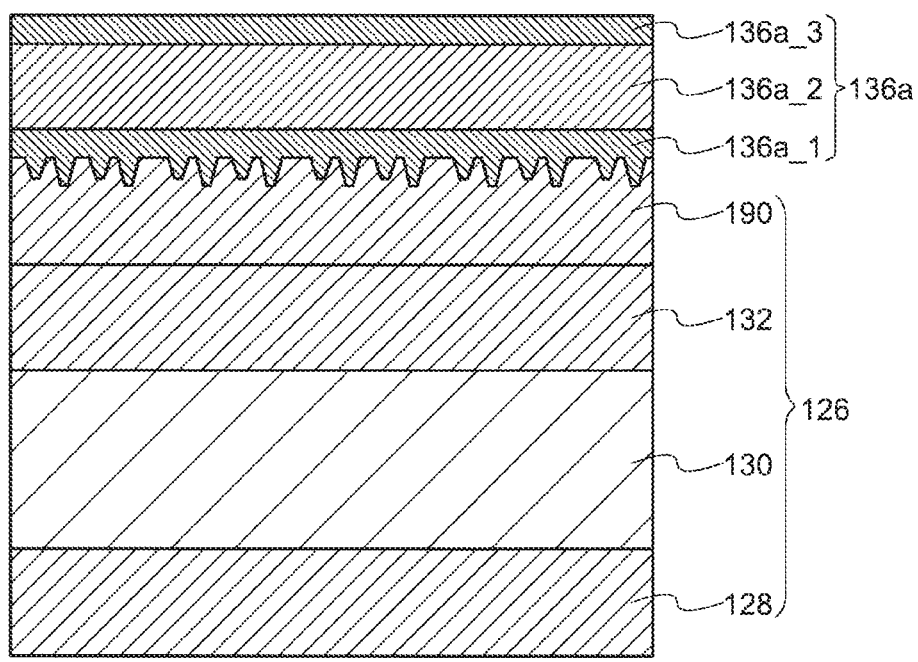
FIG. 8A is a cross-sectional diagram showing a manufacturing process of a display device related to one embodiment of the present invention.

FIG. 8A shows a state in which the first wiring 136a is arranged above the sealing layer 126. The sealing layer 126 has a structure in which the first inorganic insulating layer 128, the organic insulating layer 130, the second inorganic insulating layer 132 and the third inorganic insulating layer 190 are stacked. The surface of the third inorganic insulating layer 190 is formed with a fine concave/convex structure of about several nanometer to several hundred nanometer by a plasma treatment (etching). By providing such a concave/convex structure, the third inorganic insulating layer 190 has a structure in which wettability is improved and stress is dispersed, thereby adhesion of the first wiring 136a can be increased. Furthermore, FIG. 8A shows a structure in which the first wiring 136a is stacked with a first wiring layer 136a-1, a second wiring layer 136a_2 and a third wiring layer 136a_3. Among these, the first wiring layer 136a-1 and the third wiring layer 136a_3 are formed from a high melting point metal such as titanium (Ti), tantalum (Ta) and molybdenum (Mo). The second wiring layer 136a_2 is formed from aluminum (Al) or an aluminum alloy and the like. Even though the first wiring 136a is provided with such a stacked structure, since the contact area of the first wiring layer 136a-1 is increased due to the fine concave/convexities and stress is dispersed, it is possible to prevent peeling.

Figure 8B:
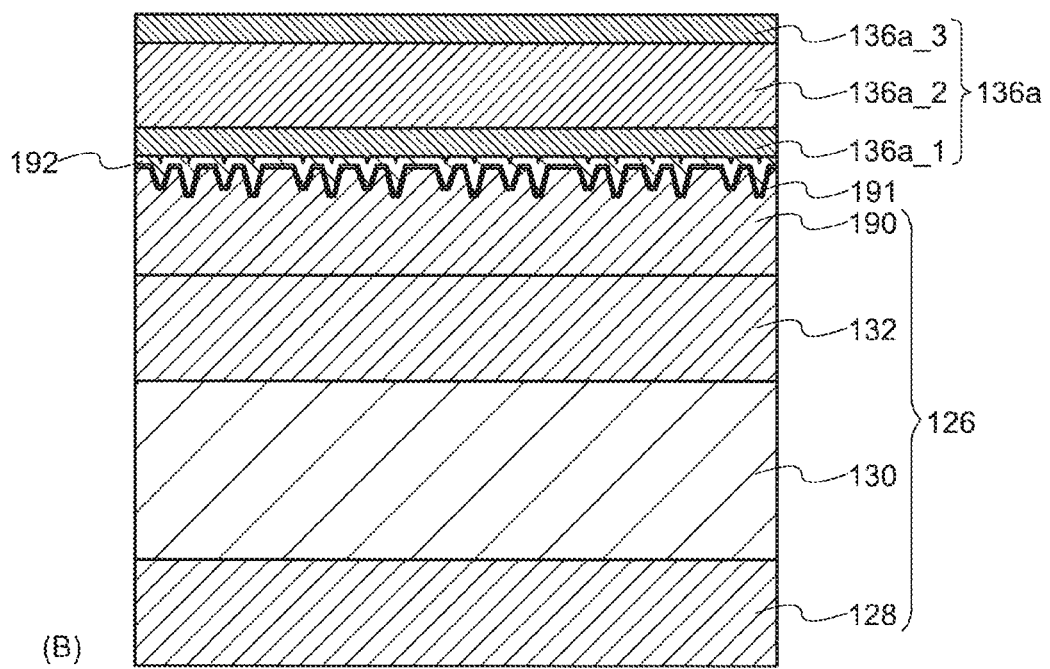
FIG. 8B is a cross-sectional diagram showing a manufacturing process of a display device related to one embodiment of the present invention.

FIG. 8B shows a state in which an oxide film 191 is formed on the surface of the third inorganic insulating layer 190. It is possible to form the oxide film 191 by a plasma treatment using oxygen or a gas containing oxygen. Alternatively, it is possible to form the oxide film 191 by etching the surface of the third inorganic insulating layer 190 using an etching gas including oxygen. For example, a mixed gas of carbon tetrafluoride ($CF_4$) and oxygen ($O_2$) can be used as an etching gas containing oxygen. In the case where the third inorganic insulating layer 190 is formed from silicon nitride, the surface is oxidized by the effects of oxygen radicals using this type of plasma treatment or etching treatment to form the oxide film 191. The thickness of the oxide film 191 may be any thickness as long as it has a thickness of 1 nm or less, for example, the oxide film 191 may have a thickness corresponding to one atomic layer to several atomic layers. Since the oxide film 191 forms a hydrophilic surface, it is possible to increase wettability and increase adhesion of the first wiring 136a.

FIG. 8B further shows a form in which the barrier metal layer 192 is arranged between the first wiring 136a and the oxide film 191. The barrier metal layer 192 prevents oxygen from dispersing from the oxide film 191 to the first wiring 136a. In this way, it is possible to prevent oxidation of the first wiring 136a and suppress high resistance. For example, titanium nitride (TiN) or the like can be used as the barrier metal layer 192. It is also possible to apply the barrier metal layer 192 to the structure shown in FIG. 8A. That is, the same operation and effect can be obtained by arranging the barrier metal layer 192 between the concave/convex surface of the third inorganic insulating layer 190 and the first wiring layer 136a-1.

According to the present embodiment, it is possible to improve the reliability of wiring by improving adhesion between a sealing layer and the wiring. Furthermore, although the structure of the third inorganic insulating layer 190 and the first wiring 136a is shown in the present embodiment, the reliability of a touch sensor can be improved by applying the same structure to the second inorganic insulating layer 132, the first detection electrode 134 and the second detection electrode 140.

Figure 7:
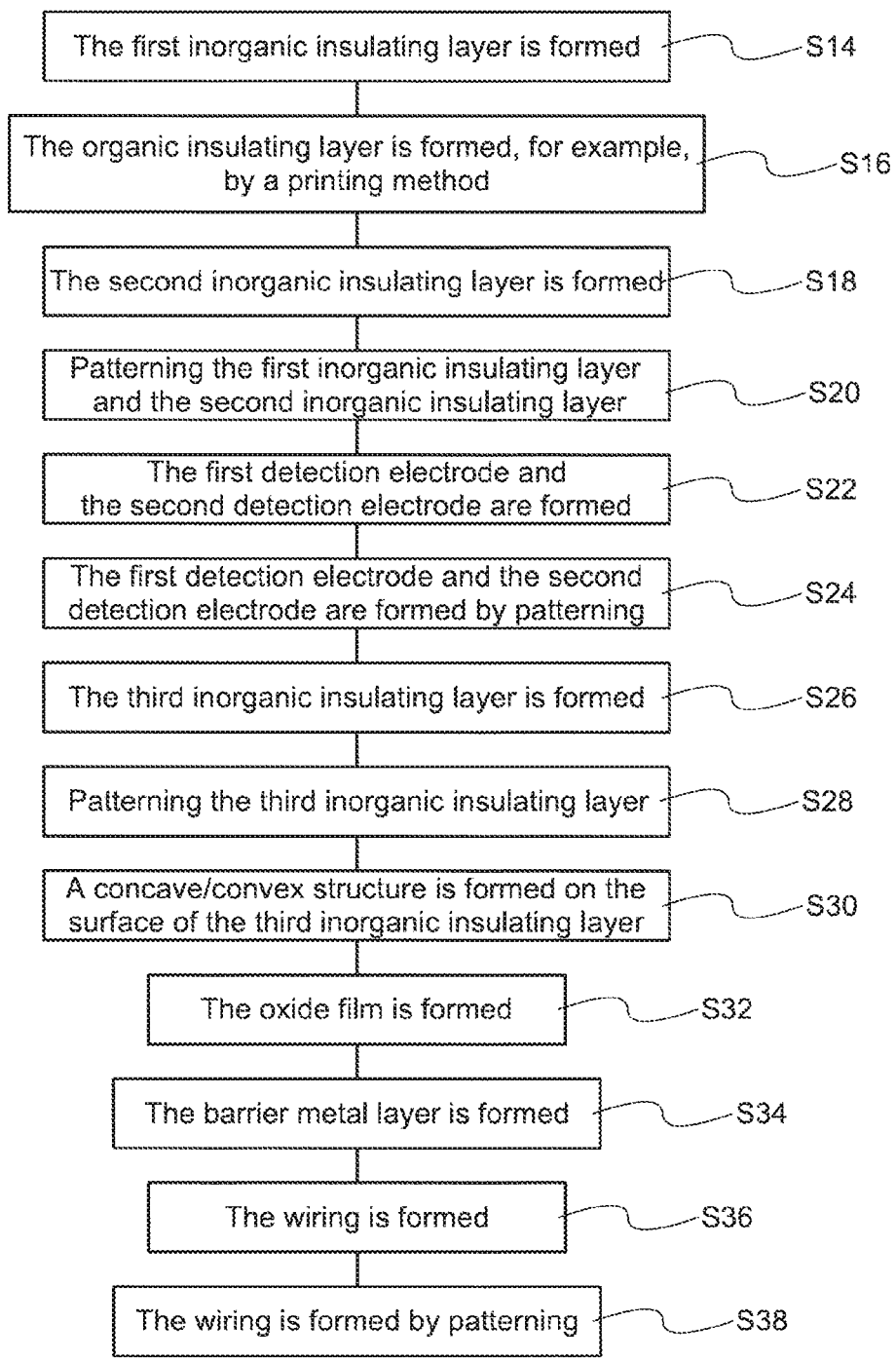
FIG. 7 is a flowchart for explaining a manufacturing method of a display device related to one embodiment of the present invention.

Next, a manufacturing method of the display device 100 is explained. FIG. 7 is a flowchart for explaining manufacturing a method of the display device 100 according to one embodiment of the present invention. FIG. 9 to FIG. 13 are cross-sectional diagrams at each stage of the display device 100 according to one embodiment of the present invention. An explanation is provided below while referring to these diagrams as appropriate.

Figure 9:
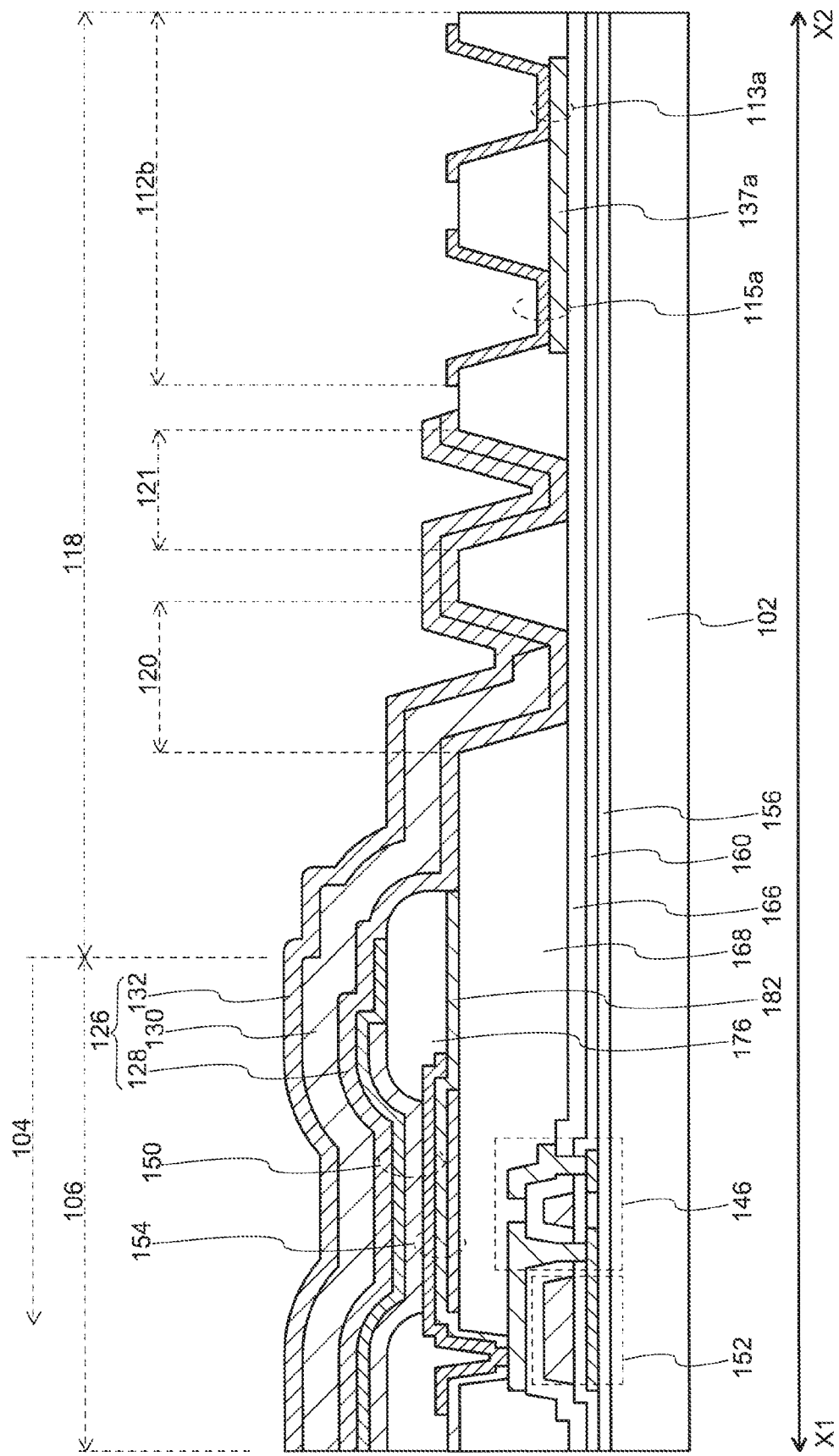
FIG. 9 is a cross-sectional diagram showing a manufacturing process of a display device related to one embodiment of the present invention.

First, after the circuit element layer 122 and the display element layer 124 are formed on one main surface of the substrate 102 which has an insulating surface, the sealing layer 126 is formed. FIG. 9 shows a cross-sectional diagram of the display device 100 at this stage.

As is shown in FIG. 9, after the transistor 146, the light emitting element 150, the first capacitor element 152, the second capacitor element 154, the second terminal 115, the first opening region 120 and the second opening region 121 are formed on the substrate 102, the first inorganic insulating layer 128 is formed to cover these (FIG. 9, FIG. 7 (S 14)). The first inorganic insulating layer 128 is formed by a vapor deposition method such as a plasma CVD method. The first inorganic insulating layer 128 is formed using a silicon nitride film or a silicon oxynitride film and the like.

Next, the organic insulating layer 130 is formed by a printing method or the like (FIG. 7 (S16)). As is shown in FIG. 9, the organic insulating layer 130 covers the pixel part 104 and is formed so that it does not protrude from the first opening region 120. The organic insulating layer 130 is formed by an inkjet method or the like. The organic insulating layer 130 is formed by ejecting a composition including a precursor of a predetermined organic resin material such as an acrylic resin, a polyimide resin or an epoxy resin from the ink head, and baking the composition after applying it onto the pixel part 104. The organic insulating layer 130 may also be formed using a photosensitive material using a development process.

Next, the second inorganic insulating layer 132 is formed (FIG. 7 (S18)). As is shown in FIG. 9, the second inorganic insulating layer 132 is formed on substantially the entire surface of the substrate 102. The second inorganic insulating layer 132 covers the organic insulating layer 130 and is formed in close contact with the first inorganic insulating layer 128 in a region where the organic insulating layer 130 is not arranged.

Since the sealing layer 126 covers the first terminal region 112a and the second terminal region 112b at this stage, a process of patterning the first inorganic insulating layer 128 and the second inorganic insulating layer 132 is performed in order to remove the sealing layer 126 which covers the first terminal region 112a and the second terminal region 112b (FIG. 7 (S20)).

Figure 10:
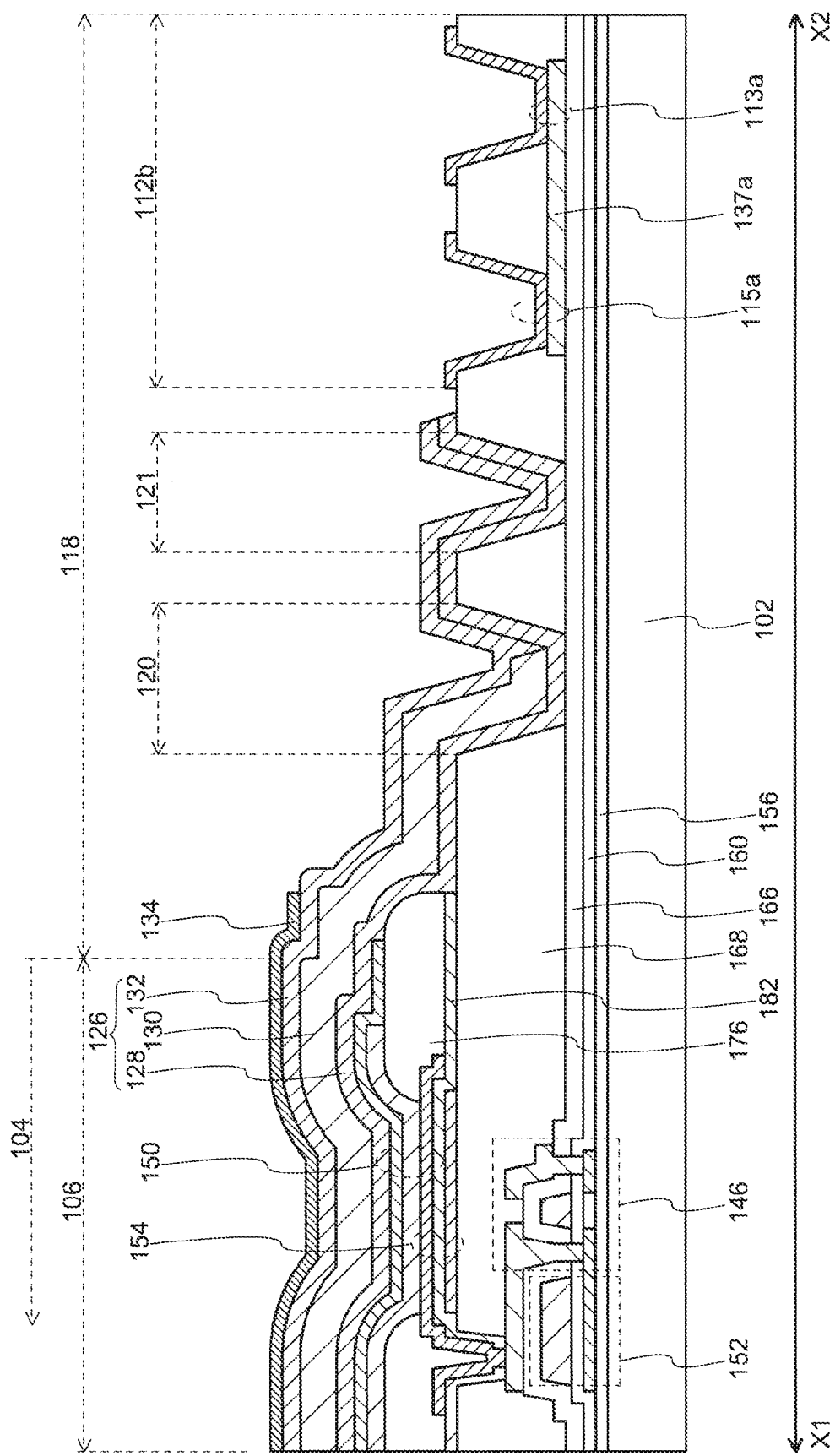
FIG. 10 is a cross-sectional diagram showing a manufacturing process of a display device related to one embodiment of the present invention.

Next, the first detection electrode 134 and the second detection electrode 140 are formed. The first detection electrode 134 and the second detection electrode 140 are formed on the sealing layer 126. In order to form the first detection electrode 134 and the second detection electrode 140, first, a transparent conductive film such as IZO is formed on substantially the entire surface of the second inorganic insulating layer 132 by a sputtering method (FIG. 10, FIG. 7 (S22)). Following this, the first detection electrode 134 is formed by patterning into a predetermined shape by a photolithography process as is shown in FIG. 10 (FIG. 7 (S24)). Furthermore, although not shown in FIG. 10, the second detection electrode 140 is also formed at the same time.

Figure 11:
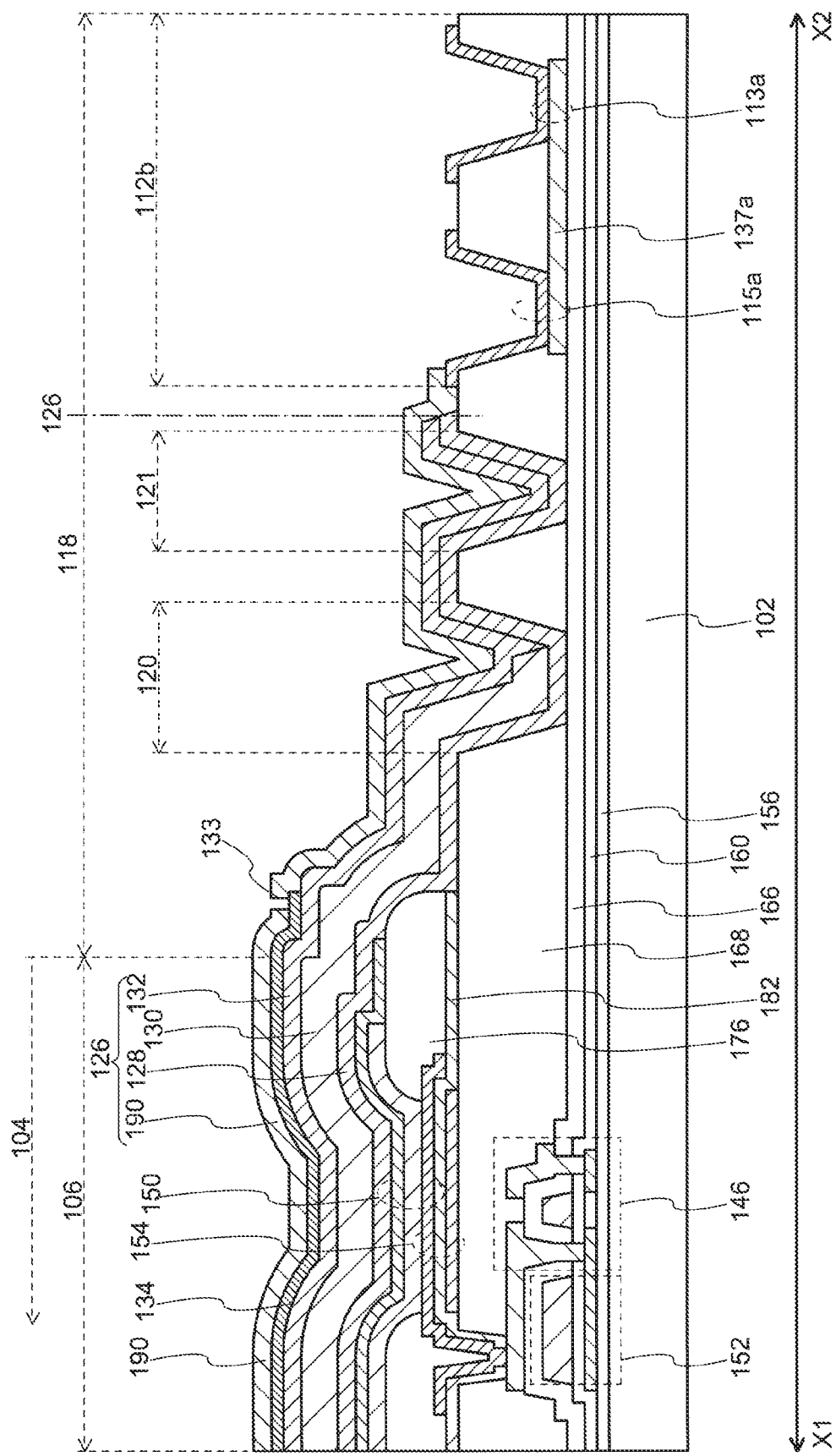
FIG. 11 is a cross-sectional diagram showing a manufacturing process of a display device related to one embodiment of the present invention.

The third inorganic insulating layer 190 is formed on an upper layer side of the first detection electrode 134 (FIG. 11, FIG. 7 (S26)). Similar to the first inorganic insulating layer 128, the third inorganic insulating layer 190 is formed from a silicon nitride film or a silicon oxynitride film and the like. At this stage, the third inorganic insulating layer 190 covers the first terminal region 112a and the second terminal region 112b. A process of patterning the third inorganic insulating layer 190 is performed in order to expose the first terminal region 112a and the second terminal region 112b (FIG. 7 (S 24)). In this patterning process, the opening part 133 which exposes the first detection electrode 134 is formed.

A fine concave/convex structure is formed on the surface of the third inorganic insulating layer 190 (FIG. 7 (S30)). The concave/convex structure is formed by etching the surface of the third inorganic insulating layer 190. For example, in the case where the third inorganic insulating layer 190 is formed from silicon nitride, a dry etching treatment is performed using gases such as carbon tetrafluoride ($CF_4$) and sulfur hexafluoride ($SF_6$), thereby it is possible to form a concave/convex structure on the surface of the third inorganic insulating layer 190. The dry etching process is performed at a low power density compared to a usual etching process. This process is performed by causing fluorine radicals generated by the etching gas to act on the third inorganic insulating layer 190. The concave/convexities which are formed on the surface of the third inorganic insulating layer 190 are fine concave/convexities and have a height of about several nanometer to several hundred nanometer. Preferably, the height is less than 30 nm.

The oxide film 191 is formed on the concave/convex surface of the third inorganic insulating layer 190 (FIG. 7 (S32)). This process is performed by oxidizing a number of monolayers on the surface of the third inorganic insulating layer 190 by a low power plasma treatment such as oxygen ashing. The thickness of the oxide film 191 is preferred to be about 5 nm in an island shape or thin film shape. Since a fine rough surface oxide film is formed by performing this type of surface treatment on the surface of the third inorganic insulating layer 190, it is possible to improve wettability.

Figure 12:
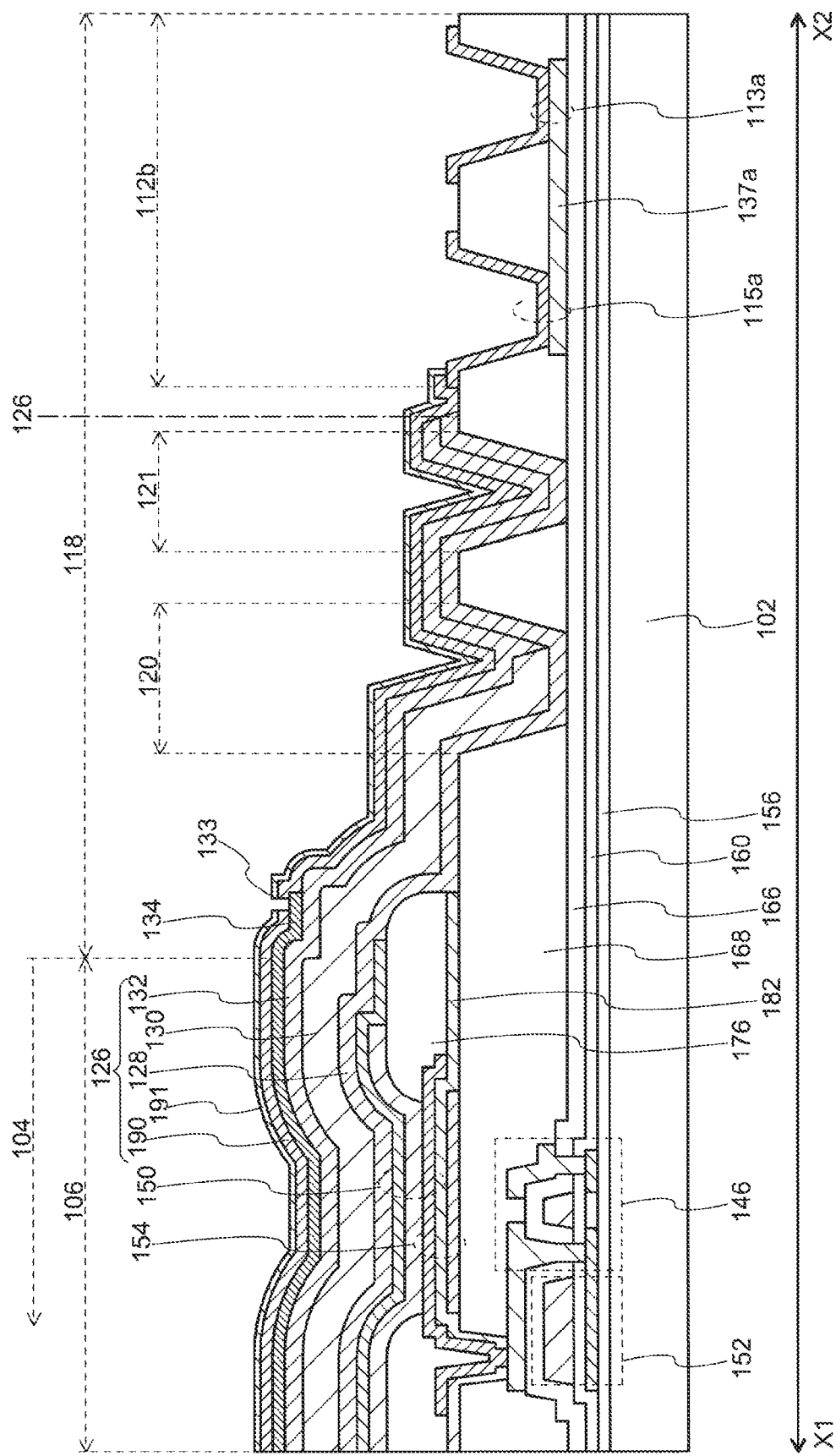
FIG. 12 is a cross-sectional diagram showing a manufacturing process of a display device related to one embodiment of the present invention.

Next, the barrier metal layer 192 is formed (FIG. 12, FIG. 7 (S34)). This step is performed in a process with a high coverage rate such as chemical vapor deposition (CVD). Titanium nitride (TiN) is used as the material of the barrier metal layer 192. The barrier metal layer 192 prevents defects caused by oxygen dispersing into the wiring from the third inorganic insulating layer 190.

Figure 13:
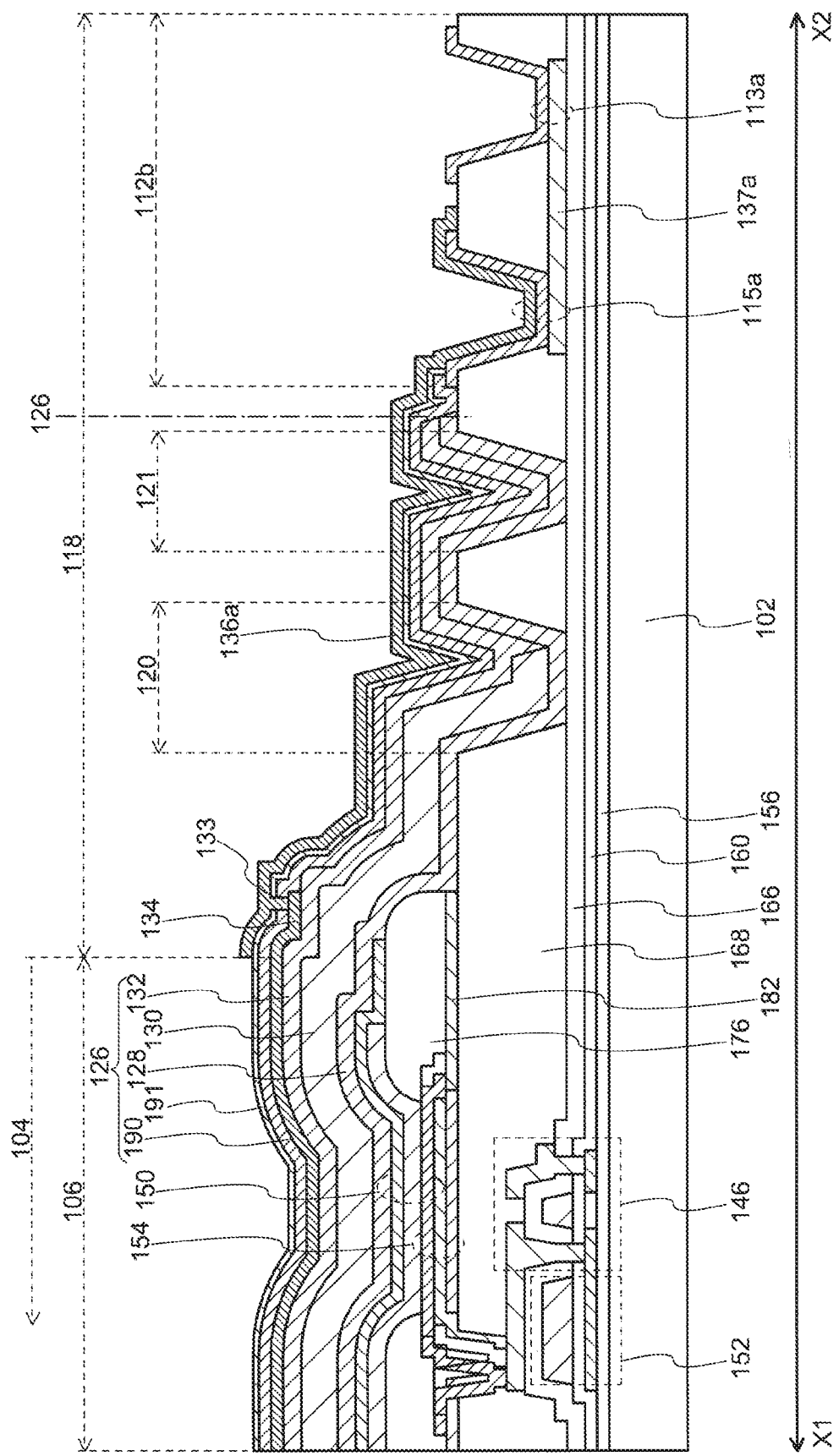
FIG. 13 is a cross-sectional diagram showing a manufacturing process of a display device related to one embodiment of the present invention.

Next, the first wiring 136a for electrically connecting the first detection electrode 134 and the second terminal 115a is formed (FIG. 13, S32). The first wiring 136a is formed above the third inorganic insulating layer 190. The first wiring 136a is formed above the third inorganic insulating layer 190 so as to overcome a step formed by the first opening region 120 and the second opening region 121. For example, as is explained in FIG. 8A, the third wiring 136a is formed with a structure in which an upper and lower part of an aluminum film are sandwiched by titanium films.

Conventionally, in this type of step section, a decrease in disconnection and connection reliability was avoided by increasing the thickness of the wiring. However, in the layer structure in which a dry etching process and the multilayer film process were performed, defects which could not be avoided were produced just by increasing the thickness of the wiring cover film at the step section due to the influence of a reverse taper structure or a micro-loading effect. That is, prevention of wiring cover film formation defects and prevention of stress distortions were insufficient, and connection reliability was insufficient. In addition, increasing the thickness of wiring was linked to a reduction in light emission resolution of a display area.

However, according to the display device according to the embodiments of the present invention described above, by treating the surface of a sealing film with a low power plasma such as oxygen ashing, fine roughness of the surface of a sealing film and a surface oxide film are formed which improves wettability. Above this, a barrier metal layer is formed by a process with high coverage properties such as a chemical vapor deposition method. As a result, even in the case when routing wiring is formed at a section where a step is produced by dry etching or formation of a multilayer film structure, it is possible to disperse stress by increasing adhesion between the routing wiring and the sealing film, thereby connection reliability of the routing wiring is improved. In addition, since adhesion between the sealing film and the overcoat layer 184 is improved, it is possible to improve the generation rate of defects such as air bubbles.

In addition, according to the display device according to an embodiment of the present invention, it is possible to simplify the manufacturing process while improving wiring reliability by using a titanium nitride (TiN) film as the barrier metal layer. That is, it is possible to form the titanium nitride film by a reactive sputtering method or a CVD method. The titanium nitride film can be dry etched, and can be patterned in the same process as the first wiring 136a which is formed using a titanium film and an aluminum film. Therefore, it is possible to simplify the manufacturing process.

What is claimed is:

1. A display device comprising:
    a substrate having a pixel region and a periphery region arranged in an outer side of the pixel region;
    a circuit element layer on the substrate;
    a display element layer on the circuit element layer; and
    a sealing film on the display element layer,
    wherein
    the sealing film includes a first inorganic insulation layer, a first organic insulation layer on the first inorganic insulation layer, a second inorganic insulation layer on the first organic insulation layer in the pixel region and extended to the periphery region, and a third inorganic insulation layer provided on the second inorganic insulation layer in the periphery region,
    an oxide film is arranged on the third inorganic insulation layer,
    a barrier metal layer is arranged on the oxide film,
    a wiring layer is arranged on the barrier metal layer,
    a top surface of the third inorganic insulation layer in contact with the oxide film has first concave/convexities in the periphery region,
    the oxide film has second concave/convexities along the top surface of the third inorganic insulation layer,
    the barrier metal layer includes titanium nitride,
    the circuit element layer includes an interlayer insulation layer having a second organic insulation layer,
    the second organic insulation layer is arranged in the pixel region and the periphery region, and has a first opening, a second opening and a patterned construction provided between the first opening and the second opening in the peripheral region,
    the second inorganic insulation layer, the third inorganic insulation layer having the first concave/convexities and the oxide film having the second concave/convexities are arranged on the second organic insulation layer, and continuously cover the first opening, the patterned construction, and the second opening of the second organic insulation layer, in the periphery region, and
    the barrier metal layer continuously covers the first opening, the patterned construction, and the second opening of the second organic insulation layer, and is provided along sidewalls of the first opening and the second opening.

2. The display device according to claim 1, wherein a height of each of the first concave/convexities of the top surface of the third inorganic insulation layer is less than 30 nm.

3. The display device according to claim 1, wherein a thickness of the oxide film is 5 nm or less.

4. The display device according to claim 1, wherein the first and second concave/convexities are provided on a surface of the patterned construction between the first opening and the second opening.

5. A display device comprising:
- a pixel part arranged with a plurality of pixels on a substrate;
- a terminal part in a periphery region arranged in an outer side of the pixel part, the terminal part including a plurality of terminal electrodes;
- a sealing layer covering the pixel part;
- a detection electrode overlapping the pixel part and arranged on the sealing layer; and
- a wiring arranged on the sealing layer and electrically connected to the detection electrode and the plurality of terminal electrodes, wherein
- the sealing layer includes a first inorganic insulation layer, a first organic insulation layer on the first inorganic insulation layer, a second inorganic insulation layer on the first organic insulation layer in the pixel region and extended to the periphery region, and a third inorganic insulation layer provided on the second inorganic insulation layer in the periphery region,
- an oxide film is arranged on the third inorganic insulation layer,
- a top surface of the third inorganic insulation layer in contact with the oxide film has a first concave/convex structures in the periphery region,
- the oxide film has second concave/convex structures along the top surface of the third inorganic insulation layer,
- the wiring is provided on the second concave/convex structures,
- the circuit element layer includes an interlayer insulation layer having a second organic insulation layer,
- the second organic insulation layer is arranged in the pixel part and the periphery region, and has a first opening, a second opening and a patterned construction provided between the first opening and the second opening in the pixel part,
- the second inorganic insulation layer, the third inorganic insulation layer having the first concave/convex structures and the oxide film having the second concave/convex structures are arranged on the second organic insulation layer, and continuously cover the first opening, the patterned construction, and the second opening of the second organic insulation layer, in the periphery region, and
- a barrier metal layer is part of the wiring and, is arranged on the oxide film and, continuously covers the first opening, the patterned construction, and the second opening of the second organic insulation layer, and is provided along sidewalls of the first opening and the second opening.

6. The display device according to claim 5, wherein a height of each of the first concave/convex structures of the third inorganic insulation layer is less than 30 nm.

7. The display device according to claim 5, wherein an organic interlayer insulating layer is included on the substrate across the pixel part and the terminal part, the organic interlayer insulating layer includes an opening part surrounding the pixel part, and the wiring is arranged intersecting the opening part.

8. The display device according to claim 5, wherein the wiring includes at least one metal layer, and the barrier metal layer is provided between the oxide film and the metal layer.

9. The display device according to claim 8, wherein the barrier metal layer is a titanium nitride film.

10. The display device according to claim 5, wherein the detection electrode is arranged between the second inorganic insulation layer and the third inorganic insulation layer,
- the wiring is arranged on the third inorganic insulation layer, and
- the detection electrode and the wiring are electrically connected by a contact hole arranged in the third inorganic insulation layer.

11. The display device according to claim 5, wherein the first and second concave/convex structures are provided on a surface of the patterned construction between the first opening and the second opening.

* * * * *